Nov. 3, 1964 C. R. ELLIS ETAL 3,155,918

COUPLING GRID MEANS FOR GROUNDED GRID AMPLIFIER

Filed Dec. 8, 1960 3 Sheets-Sheet 1

INVENTORS
CHARLES RICHARD ELLIS,
ROBERT C. McCLURE,
BY Delbert P. Warner
THEIR ATTORNEY.

COUPLING GRID MEANS FOR GROUNDED GRID AMPLIFIER

Filed Dec. 8, 1960 3 Sheets-Sheet 2

INVENTORS:
CHARLES RICHARD ELLIS,
ROBERT C. McCLURE,

BY Delbert B. Warner
THEIR ATTORNEY.

COUPLING GRID MEANS FOR GROUNDED GRID AMPLIFIER

Filed Dec. 8, 1960 3 Sheets-Sheet 3

INVENTORS:
CHARLES RICHARD ELLIS,
ROBERT C. McCLURE
BY Delbert P. Warner
THEIR ATTORNEY.

United States Patent Office 3,155,918
Patented Nov. 3, 1964

3,155,918
COUPLING GRID MEANS FOR GROUNDED GRID AMPLIFIER

Charles Richard Ellis and Robert C. McClure, North Syracuse, N.Y., assignors to General Electric Company, a corporation of New York Filed Dec. 8, 1960, Ser. No. 74,607
4 Claims. (Cl. 330—159)

The present invention relates to grounded grid amplifiers and to coupling means associated therewith. In particular, it relates to means for coupling grounded grid amplifiers to their drivers in a manner to avoid the use of choke coils in the plate circuits of the drivers and in the filament circuits of the amplifiers.

Grounded grid amplifiers are able to control large amounts of high frequency power while maintaining relatively high stability and linearity. However, the prior art grounded grid amplifiers have required the use of chokes in the filament circuit of the amplifier tube and in the plate circuit of the driver tube in order to avoid loading the driver stage and to isolate the RF signals from the supply voltages. For large tubes, which handle large amounts of power, high plate voltages and high filament currents have been involved and the choke coils required have been very large. When wide tuning ranges have been desired, these large choke coils have had to be made tunable. The present invention dispenses with the need for large choke coils, thereby reducing the component requirements of grounded grid circuits and greatly simplifying the problem of tuning such circuits.

In view of the foregoing disadvantages of the prior art, it is an object of this invention to provide for improved grounded grid coupling networks.

It is another object of this invention to provide means for eliminating the need for choke coils in grounded grid amplifier circuits.

It is still another object of this invention to provide improved means for isolating the D.-C. voltages and the RF signals present in grounded grid amplifier circuits.

It is yet another object of this invention to eliminate the need for separate tuning means in the plate circuit of the driver stage and in the filament circuit of the amplifier stage of grounded grid amplifiers.

The foregoing objects and others ancillary thereto, we prefer to accomplish as follows:

According to a preferred embodiment of the present invention, a pi coupling network is provided between the plate circuit of the driver tube and the filament of the amplifier tube in a grounded grid amplifier circuit. The pi coupling network, whether it be a configuration using an inductive stub, a multifilar transformer winding, or a coaxial inductive stub, will have a point somewhere where the RF voltage to ground will be a minimum. Each embodiment of the present invention functions in such a way that the D.-C. potentials supplied to the circuit will be supplied at this point where the RF voltage is at a minimum. In every case the B+ or plate supply voltage will be supplied directly to the plate of the driver tube, but will be isolated from the filaments of the amplifier tube; and, in every case the filament voltage will be supplied directly to the filament but will be isolated from the B+ supply. Also, in every case the plate circuit of the driver tube is coupled to the filament of the power amplifier so that the desired control of the power amplifier by the RF from the driver tube is obtained but interference between the RF signal and the D.-C. signal is prevented.

The novel features that are characteristic of this invention are set forth with particularity in the appended claims. The invention itself, however, both as to its organization and its method of operation, together with additional objects and advantages thereof, will best be understood from the following description of specific embodiments when read in connection with the accompanying drawings, in which:

Figure 1:
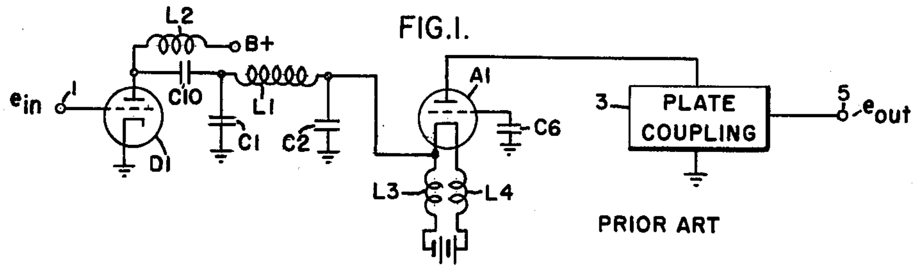
FIG. 1 is a schematic diagram illustrating a means of coupling a driver tube and a grounded grid amplifier tube in accordance with the prior art.
Figure 2:
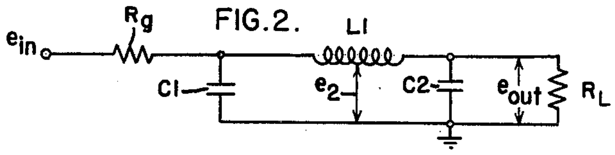
FIG. 2 is a schematic diagram illustrating a pi network which is of use in describing the operation of the present invention.
Figure 3:
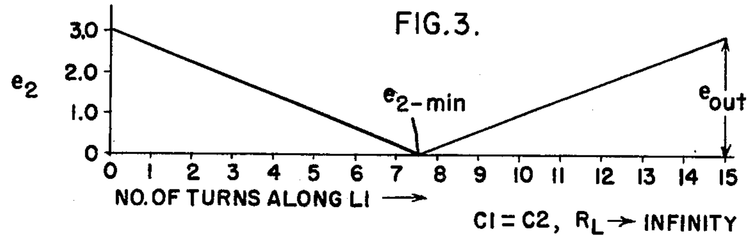
Figure 4:
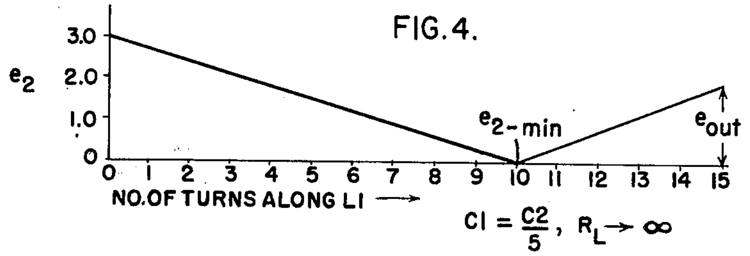
Figure 5:
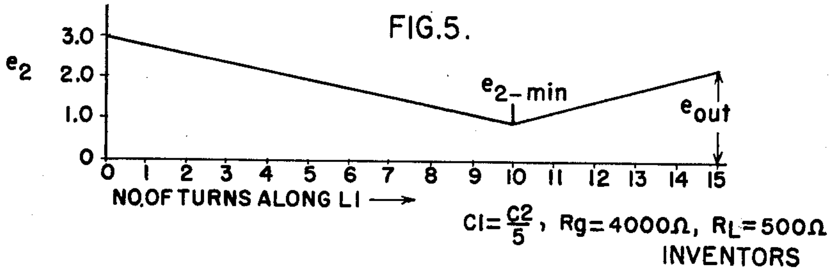
Figure 6:
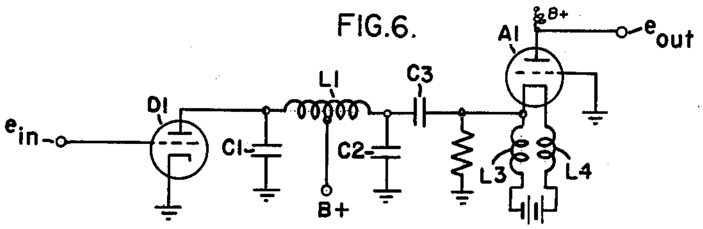
Figure 7:
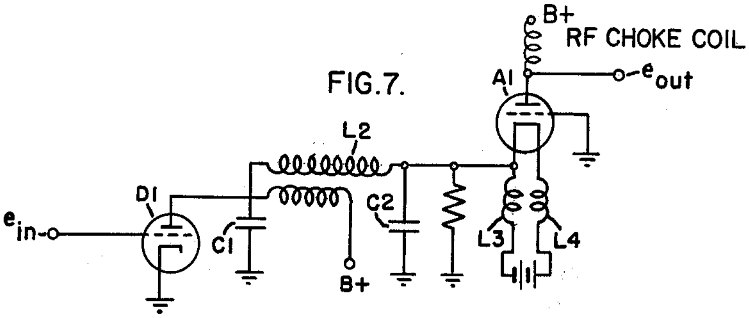
Figure 8:
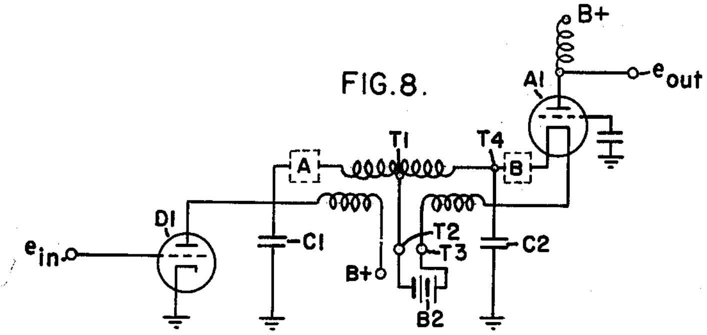
Figure 9:
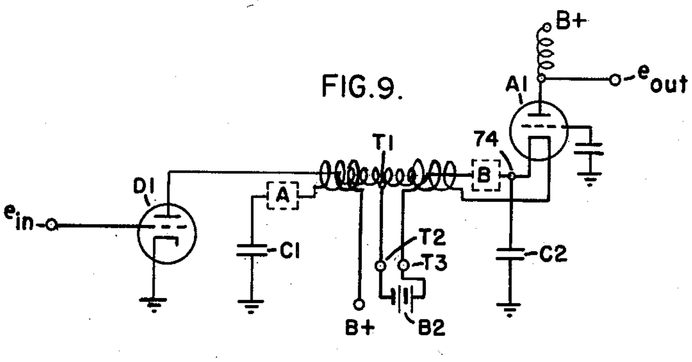
Figure 10:
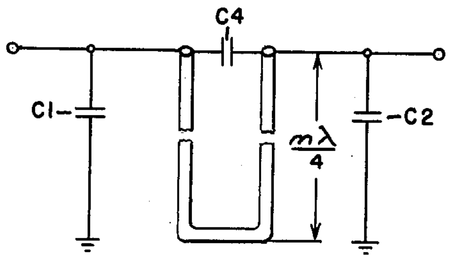
Figures 11, 12:
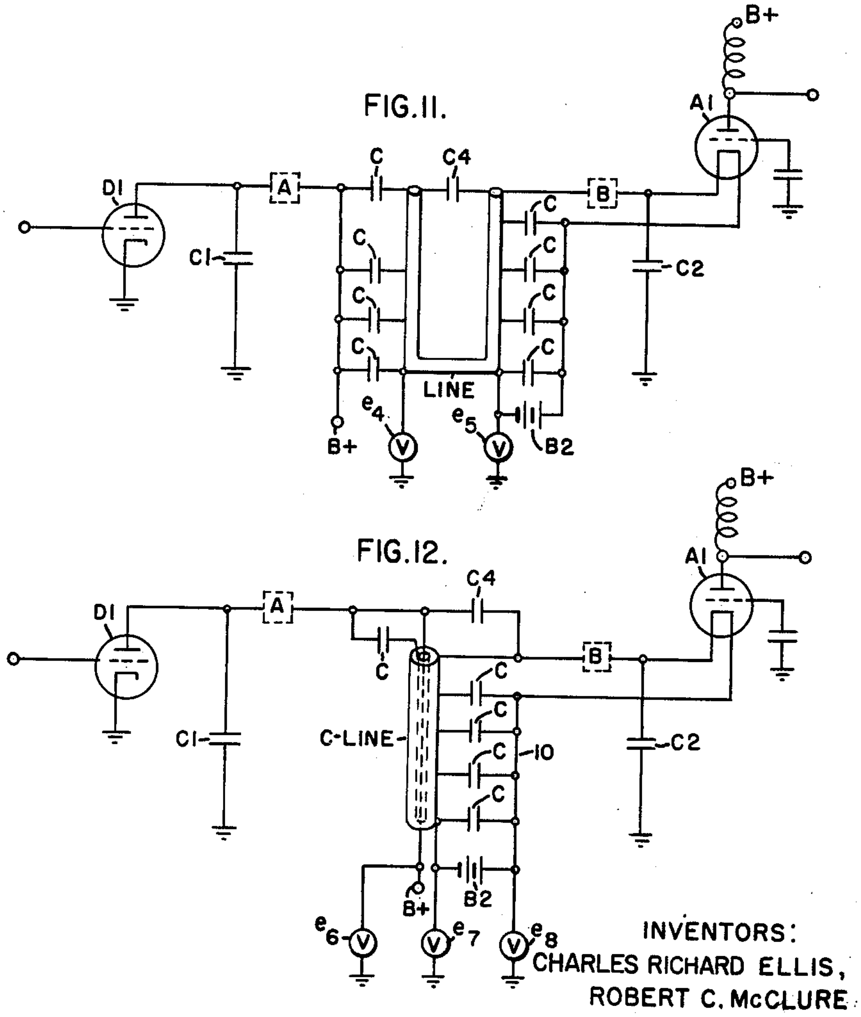

FIGS. 3, 4, and 5 are graphs drawn to illustrate the operation of the circuit of FIG. 2 under varying circumstances;

FIG. 6 is a schematic diagram to illustrate a mode of operation of the prior art device of FIG. 1 in view of the discussion associated with FIGS. 3, 4, and 5;

FIG. 7 is a schematic diagram of a variation of the circuit of FIG. 6 embodying a portion of the present inventive concept;

FIG. 8 is a schematic diagram illustrating an embodiment of the present invention;

FIG. 9 is a schematic diagram illustrating another embodiment of the present invention;

FIG. 10 is a schematic diagram showing the use of a pi matching section employing a transmission line as the inductive portion thereof;

FIG. 11 is a schematic diagram illustrating the employment of the pi matching section of FIG. 10 with the present invention; and FIG. 12 illustrates yet another variation of the present invention in which a coaxial cable is used as the inductive element.

Turning first to FIG. 1, there is illustrated a driver tube D-1 which is coupled through a pi network to drive the filament of a power amplifier tube A1 in the manner of the prior art devices. In this circuit the input potential $e_{in}$ is supplied at terminal 1 to the grid of the driver tube D-1 in a conventional way to control the output appearing on the plate of the driver tube. This output potential is supplied through the capacitor C10 and through a pi coupling network made up of condensers C1 and C2, and inductance L1 to the filament of the power amplifier tube A1. Since the grid of amplifier tube A1 is grounded through the condenser C6, as indicated, the potential appearing on the filament of the tube will drive the tube to provide an output through the plate coupling device in block 3 to the output terminal 5, where the potential is labelled $e_{out}$. As is indicated in FIG. 1, it is necessary to isolate the D.-C. power supplies to the plate of the driver tube on the one hand, and to the filament of the power amplifier tube on the other, and this is done by directing the appropriate D.-C. voltages through choke coils L2, L3, and L4, as illustrated. As has previously been indicated, these choke coils must include provisions for being tuned if it is desired to amplify signals throughout a wide range of frequencies.

A common system of coupling is the pi network, shown in FIG. 2 in a lumped circuit configuration. This circuit is much like the pi network of FIG. 1 and has been placed here separately for purposes which will now be made apparent. Where the input potential to a pi network, such as that shown in FIG. 2, is composed of RF signals there will be a point along the inductance coil L1 at which a minimum RF potential will exist. This potential is labelled as voltage $e_2$ in FIG. 2, and under some circumstances will be zero volts and under others it will have some value less than $e_{in}$.

The chart illustrated in FIG. 3 is intended to show the distribution of potential along the inductance coil L1 of FIG. 2 under selected conditions. In FIG. 3 the condensers forming the arms of the pi network C1 and C2 are of equal magnitude and the load resistance $R_L$ is given as being very large and as approaching infinity. Under these circumstances the minimum potential will appear at the center of the coil, corresponding to a point midway between the seventh and eighth coils, where there are fifteen coils in the inductor and the numbers 1 through 15 on the graph represent the coils. This value of $e_{2\ min}$ will be zero, or very nearly so, under these circumstances.

If the values of some of the components illustrated in FIG. 2 are changed so that condenser C2 is five times as large as condenser C1 and the load resistance $R_L$ again is very large and approaches infinity, the distribution of potentials through the coil windings will be as shown in FIG. 4, where it is indicated that the minimum occurs at the tenth winding of the coil.

If the values in FIG. 2 are changed so that C2 is five times as large as C1, $R_g$=4000 ohms and $R_L$=500 ohms, the distribution of potential through the windings of the inductor L1 would be as shown in FIG. 5. In the case of FIG. 5, which represents a condition where actual power is being delivered by the circuit, the minimum potential appearing on the windings of the inductor L1 is not zero, but there is a very definite point where a minimum potential will be found. It is apparent that, other things being equal, minimum interference between the RF potentials and D.-C. potentials occurring in the circuit will occur if connections introducing D.-C. to the circuit are made at this point.

An application of the principle indicated in the foregoing paragraph is made in the circuit illustrated in FIG. 6. In this circuit the B+ potential is supplied through the inductance coil L1 at a point where the RF signal is at a minimum and thence to the plate of the driver tube D1. In FIG. 6 the B+ signal is isolated from the power amplifier by a condenser C3. In addition to condenser C3, choke coils L3 and L4 must still be used in the filament circuit to prevent loading of the radio frequency signal by the filament supply and so the objections to the circuit of FIG. 1 are only partially overcome.

In order to dispense with the condenser C3 of FIG. 6, a transformer coupling such as L2 may be employed as shown in FIG. 7. In this case, B+ is supplied at a point near the place where the minimum RF potential will occur under most load conditions and is transmitted through a winding to the plate of the driver tube D1 as indicated. The RF signal, in turn, will be transmitted through the transformer by induction to the filament of the power amplifier tube A–1. It will be noted that with the circuit of FIG. 7, the choke coils L3 and L4 are still required in the filament circuit of the power amplifier A–1.

To this point the discussion has largely centered around theory of operation and the state of the prior art devices. FIG. 7 is the first instance in which the central theme of the present invention has been shown. In that instance, it was shown only to the extent of eliminating the need for choke coils in the plate circuit of the driver tube, but turning now to FIGS. 8 and 9, we find circuits which more fully utilize the present invention. In FIGS. 8 and 9 the inductive portion of the pi network has been replaced by transformer windings. In FIG. 8 the windings are shown separately for purposes of illustration, but normally the three windings are bi-filarly wound, as shown in FIG. 9, to provide the desired isolation between the RF signals and the D.-C. signals. As shown in FIGS. 8 and 9, the B+ potential is supplied through a first one of the three windings to the plate of the driver tube D1. A second winding is connected from the condenser C1 through a terminal T1 to a first terminal T2 of the battery B2, to one terminal T4 of the condenser C2, and to the filament of the power amplifier tube A1. The other side of the filament of the power amplifier tube A1 is then inductively coupled by means of a third winding to half of this second winding and is connected through the third winding to the second terminal T3 of the battery B2. In this way the B+ signal is provided to the plate of the driver tube D1, the B2 potential is supplied across the filament, and the RF signal is supplied inductively through the winding of the transformer to control the filament and thus to control the amplification of power amplifiers A1. This transformer winding reduces the interference between the RF and the D.-C. potentials to a minimum; but the two potentials B+ and B2, in the preferred embodiment, will be brought to the windings of the transformer network at a point corresponding to that at which the RF signals will be at their minimum value, as explained in connection with the circuits illustrated in FIG. 2, FIG. 3, FIG. 4, and FIG. 5. The blocks labelled A and B may contain inductances which will make it possible to shift the exact position of the minimum point of the RF potential to coincide more closely with the point of admission of the D.-C. potentials.

The circuit of FIG. 10 illustrates a pi matching section of a different character. A transmission line is substituted in FIG. 10 for the transformer of FIGS. 8 and 9 with a condenser C4 functioning as capacity end loading. The transmission line may be a quarter wavelength long as illustrated in FIG. 10 or it may be any number of times the quarter-wavelength or $n\lambda/4$, where $n$ is odd. A pi matching section may, therefore, take the form shown in FIG. 10, and may be substituted for the transformer in a circuit such as FIG. 9.

Substitution of the pi matching section of FIG. 10 for the transformer of FIG. 8 will result in a circuit having a configuration such as that of FIG. 11, where C4 is used to tune the line to present +J reactance. Condensers C1, C2, C4, and the line in combination, provide a pi matching section to couple the driver tube D1 to the power amplifier tube A1. If C1 is not equal to C2, then additional inductance may be added at block A or at block B. The inductance will be added in block A if C2 is greater than C1, and will be added in block B if C1 is greater than C2, in order that the RF voltages $e_4$ and $e_5$ will be zero. The capacitors labelled C serve only to couple the plate from the driver tube D1 and the filament of the power amplifier tube A1 to the transmission line. As indicated in FIG. 11, no choke coils are necessary in this system. The system may be tuned by varying C1, C2, or C4 over a wide frequency range with no sliding contacts. It has been established that the circuit of FIG. 11, with proper design, may be tuned over a wide range, such as from 50 to 150 megacycles per second.

FIG. 12 illustrates the invention applied to a coaxial transmission line which has been labelled "C-line." In FIG. 12, the coaxial line may be tuned to present a positive reactance by means of a condenser C4. The elements C1, C2, C4 and the C-line in combination then provide a pi matching section. Driver plate voltage B+ is applied through the hollow linear conductor of the C-line to the plate of D1. The filament voltage from the battery B2 is supplied through the outer conductor and a lead 10 to the filament of the power amplifier A1. Lead 10 may alternatively be passed through a hollow conducting tube making an electrical contact with the outer layer of the C-line. As in FIG. 11, if the condenser C1 is not of the same capacitance as C2, inductance may be inserted at A or B to adjust the RF voltages $e_6$, $e_7$, and $e_8$ to be zero. No choke coils are required in this circuit and no sliding contacts are required to tune the circuit over very wide ranges, such as from 50 to 150 megacycles per second.

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefore intended to cover and embrace any such modifications within the limits of the true spirit and scope of the invention.

What we claim and desire to secure by Letters Patent of the United States is:

1. A grounded grid amplifier circuit for isolating RF signals from plate supply voltages and from filament voltages comprising:

(a) a driver stage including an electron tube having a plate coupled through a first transformer winding to a source of plate supply voltage, (b) an amplifier stage including an electron tube having a grounded grid and having a first terminal of its filament coupled through a second transformer winding to receive RF signals from said first transformer winding, and (c) a source of filament supply voltage having a first terminal coupled through a third transformer winding to a second terminal of said filament and having a second terminal coupled to an intermediate terminal in said second transformer winding.

2. A grounded grid amplifier circuit comprising:

(a) a driver stage including an electron tube having a plate coupled through first coupling means capable of transformer action with suitable couplers to a source of plate supply voltage, (b) an amplifier stage including an electron tube having a grounded grid and having a first terminal of its filament coupled through second coupling means capable of transformer action in concert with said first coupling means to enable it to receive RF signals from said first coupling means, and (c) a source of filament supply voltage having a first terminal coupled through third coupling means capable of transformer action in concert with said second coupling means to a second terminal of said filament and having a second terminal connected to an intermediate terminal in said second coupling means.

3. A grounded grid amplifier circuit substantially as claimed in claim 1 in which the transformer windings are bifilarly wound.

4. A grounded grid amplifier circuit substantially as claimed in claim 2 in which the coupling means comprise a transmission line.

References Cited in the file of this patent

UNITED STATES PATENTS

| | | |
|---|---|---|
| 1,603,432 | Warren | Oct. 19, 1926 |
| 2,524,821 | Montgomery | Oct. 10, 1950 |
| 2,673,254 | Eland | Mar. 23, 1954 |
| 2,775,659 | Nelson | Dec. 25, 1956 |
| 2,802,066 | Woll | Aug. 6, 1957 |